United States Patent
Tsuchida

(10) Patent No.: US 10,515,836 B2
(45) Date of Patent: Dec. 24, 2019

(54) CERAMIC MEMBER

(71) Applicant: NGK SPARK PLUG CO., LTD., Nagoya-shi, Aichi (JP)

(72) Inventor: Atsushi Tsuchida, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 260 days.

(21) Appl. No.: 15/659,051

(22) Filed: Jul. 25, 2017

(65) Prior Publication Data
US 2018/0033668 A1   Feb. 1, 2018

(30) Foreign Application Priority Data

Jul. 29, 2016   (JP) .................................. 2016-150798

(51) Int. Cl.
| | |
|---|---|
| H02N 13/00 | (2006.01) |
| H01L 21/683 | (2006.01) |
| H01L 21/67 | (2006.01) |
| B32B 18/00 | (2006.01) |
| C04B 35/111 | (2006.01) |

(52) U.S. Cl.
CPC .... *H01L 21/6833* (2013.01); *H01L 21/67103* (2013.01); *H01L 21/6831* (2013.01); *B32B 18/00* (2013.01); *C04B 35/111* (2013.01); *C04B 2235/3217* (2013.01); *H02N 13/00* (2013.01)

(58) Field of Classification Search
USPC ........................................................ 361/234
See application file for complete search history.

(56) References Cited

U.S. PATENT DOCUMENTS

| | | | | |
|---|---|---|---|---|
| 6,617,514 | B1* | 9/2003 | Ushikoshi | ........... H01L 21/6833 174/84 R |
| 8,414,704 | B2* | 4/2013 | Fujii | ................... C23C 16/4586 118/728 |
| 2009/0176065 | A1 | 7/2009 | Takebayashi et al. | |
| 2014/0355170 | A1* | 12/2014 | Wada | ................... B23Q 3/1543 361/234 |
| 2017/0140954 | A1 | 5/2017 | Kitagawa et al. | |

FOREIGN PATENT DOCUMENTS

| | | |
|---|---|---|
| JP | 2009-188394 A | 8/2009 |
| TW | 201611179 A | 3/2016 |

OTHER PUBLICATIONS

Taiwan Intellectual Property Office, Office Action issued in corresponding Application No. 106125446, dated Jan. 30, 2019. (English translation is not available.).

\* cited by examiner

*Primary Examiner* — Danny Nguyen
(74) *Attorney, Agent, or Firm* — Stites & Harbison, PLLC; Jeffrey A. Haeberlin; James R. Hayne

(57) ABSTRACT

This ceramic member 100 includes: a ceramic base body 10 having a terminal 30 embedded therein; a blind hole 11 formed in the ceramic base body 10 and causing the lower surface of the ceramic base body 10 and the terminal 30 to communicate with each other; and a connection member 40 inserted in the blind hole 11, the connection member 40 connected to the terminal 30 by means of a brazing material solidified portion 70. In the blind hole 11, the space surrounded by the inner peripheral surface of the blind hole 11 has, at least at a bottom face 11*a*, an enlarged portion 11*b* that is enlarged toward the upper side at least partially with respect to the circumferential direction, and at least a part of the brazing material solidified portion 70 is present in the enlarged portion 11*b*.

5 Claims, 2 Drawing Sheets

CERAMIC MEMBER

CROSS REFERENCE TO RELATED APPLICATION

The present application claims priority to Japanese Patent Application No. 2016-150798, which was filed on Jul. 29, 2016, the disclosure of which is herein incorporated by reference in its entirety.

BACKGROUND OF THE INVENTION

Field of the Invention

The present invention relates to a ceramic member, and in particular, to a ceramic member in which a metal member embedded in a ceramic base body has another metal member brazed to the metal member.

Description of Related Art

In a ceramic member, such as an electrostatic chuck or an RF susceptor, used in a semiconductor production device or the like, a voltage is applied through a power feeding rod to a terminal of an electrode, a heater, or the like embedded therein. Thus, in many cases, a metal connection member connected to the power feeding rod is connected to the terminal made of metal.

Inside a blind hole formed in a ceramic base body, the connection member is connected by brazing to the terminal exposed at the bottom face of the blind hole.

For example, Patent Document 1 discloses the following: the diameter of an end portion on the joining surface side of a connection member joined with a metal terminal is reduced; and redundant brazing material is allowed to flow into the gap between the end portion of the terminal having the reduced diameter and a blind hole formed in a ceramic base body, whereby a joining layer formed by the brazing material between the connection member and the terminal is made thin, thereby to secure the joining strength.

Patent Document 1 also describes the following: a braze pool space is provided in a part of a lateral surface of the blind hole formed in the ceramic base body; and the brazing material is filled in this braze pool space so as to be integrated with the brazing material that connects the connection member and the terminal together, thereby enhancing the torsional breaking strength between the connection member and the terminal.

RELATED ART DOCUMENT

Patent Document 1 is Japanese Patent Application Laid-Open (kokai) No. 2009-188394.

BRIEF SUMMARY OF THE INVENTION

However, with the technology described in Patent Document 1 above, there are cases where the joining strength between the connection member and the terminal cannot be sufficiently secured.

Therefore, an object of the present invention is to provide a ceramic member that can enhance the joining strength between the connection member and the terminal.

In accordance with one aspect of the invention, a ceramic member includes: a ceramic base body having a first metal member embedded therein; a blind hole formed in the ceramic base body and causing a lower surface of the ceramic base body and the first metal member to communicate with each other; and a second metal member inserted in the blind hole, the second metal member connected to the first metal member by means of a brazing material solidified portion, wherein in the blind hole, a space surrounded by an inner peripheral surface of the blind hole has, at least at a bottom face of the blind hole, an enlarged portion that is enlarged outwardly at least partially with respect to a radial direction, and at least a part of the brazing material solidified portion is present in the enlarged portion. In other words, the ceramic member includes a ceramic base body, a first metal member embedded in the ceramic base body, a second metal member, and a brazing material solidified portion. The ceramic base body includes a lower surface and an inner surface. The inner surface and the first metal member define a blind hole between the lower surface and the first metal member. The second metal member is inserted in the blind hole. The brazing material solidified portion connects the second metal member to the first metal member. The inner surface of the ceramic base body has, at least at the first metal member, an enlarged portion that is enlarged outwardly, at least partially, in the radial direction. At least a part of the brazing material solidified portion is present in the enlarged portion.

According to the present invention, at least a part of the brazing material solidified portion present between the first metal member serving as a terminal, for example, and the second metal member serving as a connection member, for example, is present in the enlarged portion of the blind hole. Accordingly, this portion exhibits anchor effect, thus enhancing the joining strength between the first metal member and the second metal member.

In the present invention, preferably, the enlarged portion is enlarged outwardly over an entire circumference thereof with respect to the radial direction at the bottom face of the blind hole.

In this case, the joining strength between the first metal member and the second metal member can be enhanced over the entire circumference of the enlarged portion.

In the present invention, preferably, the brazing material solidified portion is a layer formed as a result of solidification of a brazing material that has higher wettability to the first and second metal members than to the ceramic base body.

In this case, it is preferable to use a brazing material that does not contain a so-called active metal. When the brazing material contains an active metal, a melt of the brazing material has poor fluidity at a temperature higher than or equal to the melting point thereof. Thus, even if a space is present, the melt is relatively difficult to be filled in the space. In contrast to this, a brazing material made of a pure metal or a metal brazing material not containing any active metal has, when in a melt state, relatively high fluidity and higher wettability to metal than to ceramics, and thus, can be filled in the space.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
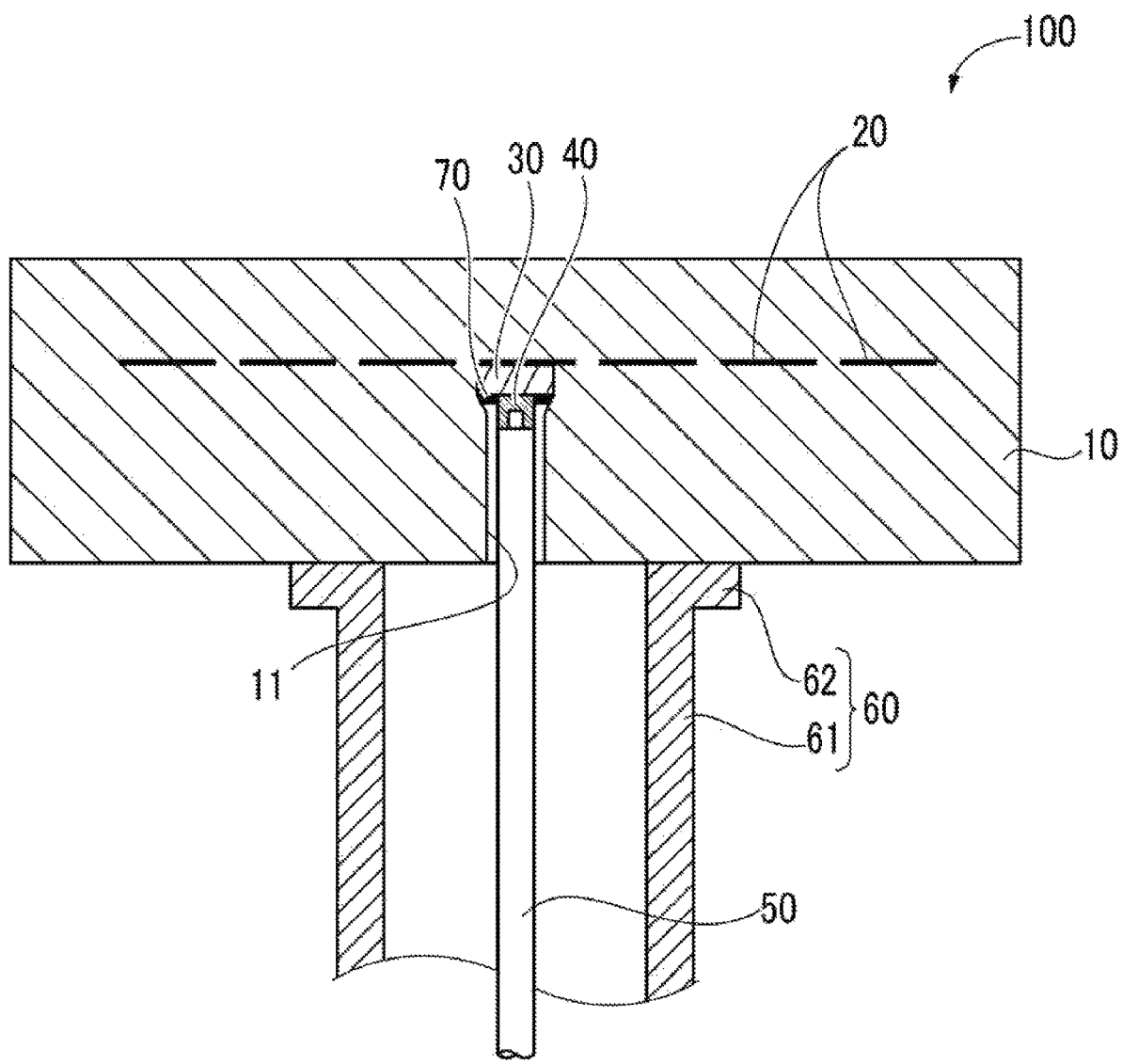
FIG. 1 is a cross-sectional view of a ceramic member according to an embodiment of the present invention.
Figure 2:
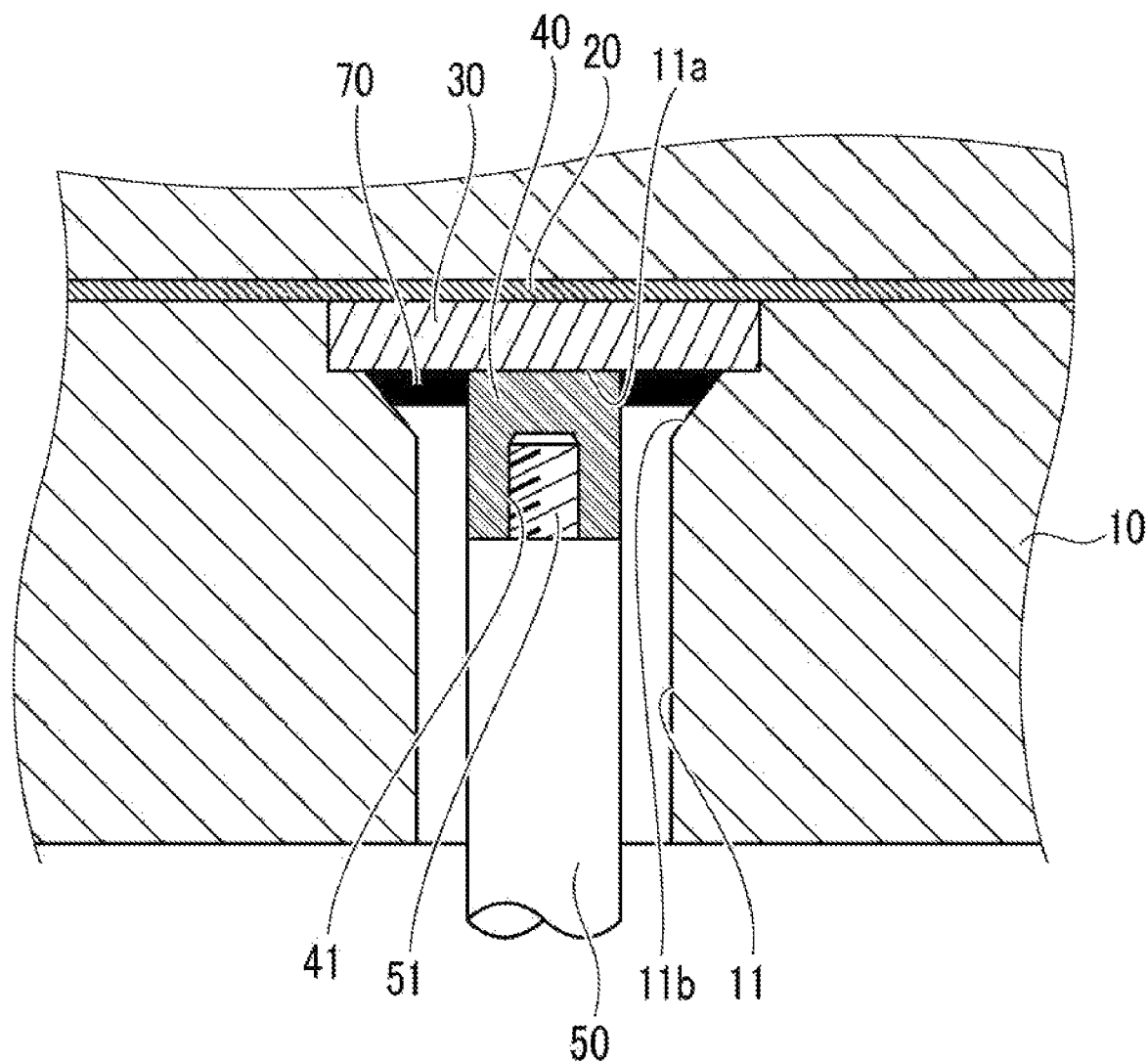
FIG. 2 is a partial enlarged cross-sectional view of the ceramic member.

A ceramic member 100 according to an embodiment of the present invention is described with reference to FIG. 1 and FIG. 2.

The ceramic member 100 includes a ceramic base body 10, a metal body 20, a terminal (first metal member) 30, a connection member (second metal member) 40, a power feeding rod 50, and a shaft 60.

The ceramic member 100 here is an electrostatic chuck in which the metal body 20 functions as an electrode, and which suctions a substrate to a surface of the ceramic base body 10 by Coulomb force generated as a result of a voltage being applied from the power feeding rod 50 to this electrode through the terminal 30 and the connection member 40.

However, the ceramic member 100 may be a heater in which the metal body 20 functions as a heating resistor (heater), and which heats a substrate placed on the surface of the ceramic base body 10, by heat generated as a result of a voltage being applied from the power feeding rod 50 to this heater.

Further, the ceramic member 100 may be an electrostatic chuck having a heater function in which: a metal body 20 close to the surface functions as an electrode; and a metal body 20 away from the surface functions as a resistive heating element.

The metal body 20 is embedded in the ceramic base body 10, and the terminal 30 is connected to the rear surface of the metal body 20.

Here, the ceramic base body 10 is composed of ceramic sintered bodies made from aluminium nitride (AlN). However, the ceramic base body 10 may be composed of ceramic sintered bodies or the like made from a raw material that is used as a material of a base body for an electrostatic chuck or a heater, such as alumina ($Al_2O_3$), yttria ($Y_2O_3$), or the like.

The ceramic base body 10 is composed of ceramic sintered bodies formed through hot press sintering of molded bodies that are each obtained by molding, for example, a high purity (e.g., 99.9% purity or higher) aluminium nitride powder or a mixed raw material powder which is composed of: the high purity aluminium nitride powder; and an appropriate amount of a sintering agent such as yttrium oxide powder added as necessary.

The metal body 20 is made of a metal such as tungsten, molybdenum, an alloy of these, platinum, or titanium, and is in the form of thin plate, thin film, mesh, line, or the like.

By hot pressing the ceramic sintered bodies having the metal body 20 interposed therein, the metal body 20 in the form of a metal mesh or a metal foil is embedded in the ceramic base body 10. However, the embedding method is not limited thereto. For example, with a metal powder serving as the material of the metal body 20 interposed in the above-mentioned mixed raw material, the entirety thereof may be hot pressed. Alternatively, a recessed portion is formed in the joining surface of the ceramic sintered bodies, the metal body 20 is embedded therein, and then, the ceramic sintered bodies may be joined together by means of a joining material.

On the surface of the ceramic base body 10, a protection layer or the like may be formed. A cooling structure may be provided in the ceramic base body 10.

In the ceramic base body 10, a blind hole 11 having an opening on the lower surface (rear surface) of the ceramic base body 10 and extending in the up-down direction (i.e., the vertical direction as shown and as typical when in use) is formed. One blind hole 11 is formed for each terminal 30. Each blind hole 11 is formed through, for example, grinding work using a drill or the like.

The blind hole 11 is a hole having a substantially columnar shape as a whole. However, the space surrounded by the inner peripheral surface of the blind hole 11 has, at least at a bottom face 11a, an enlarged portion 11b which is enlarged toward the outside (i.e., toward the upper side of the ceramic base body 10) at least partially with respect to the circumferential direction. Here, the enlarged portion 11b is an enlarged-diameter portion which is enlarged over the entire circumference thereof at the bottom face 11a of the blind hole 11. However, although not shown, the enlarged portion 11b may be, at the bottom face 11a of the blind hole 11, enlarged at one or a plurality of portions, i.e., partially, with respect to the circumferential direction.

Here, the cross-sectional shape of the enlarged portion 11b (enlarged-diameter portion) along the axis in the up-down direction of the blind hole 11 is a right-angled triangle shape. However, the cross-sectional shape of the enlarged portion 11b (enlarged-diameter portion) is not limited thereto, and may be a trapezoid or a rectangle, and further, may be a shape having a curved portion, for example.

With respect to the blind hole 11, for example, the diameter of the columnar portion is 4 mm, and the base of the right-angled triangle of the enlarged portion 11b (enlarged-diameter portion) is 0.25 mm and the height thereof is 3 mm. In this manner, it is sufficient that the enlarged portion (enlarged-diameter portion) 11b of the blind hole 11 is enlarged by a fraction in the range of ½ to ¹⁄₂₀ both exclusive of the diameter of the columnar portion.

It should be noted that the enlarged portion 11b (enlarged-diameter portion) may be formed through cutting work or the like using an eccentric drill or the like. In the drawing, the corner of the enlarged portion (enlarged-diameter portion) 11b is depicted to have an acute angle, but actually, is rounded corresponding to the shape of the corner portion of the tool that processes the enlarged portion (enlarged-diameter portion) 11b.

The terminal 30 is made of a metal such as tungsten, molybdenum, an alloy of these, or platinum, is electrically connected to the metal body 20, and corresponds to a first metal member of the present invention. The terminal 30 may be composed of a metal sintered body formed, for example, by: forming a thick layer of a metal powder such as a tungsten powder; interposing, in the above-mentioned mixed material, the metal powder layer with the metal body 20 connected thereto; and then, hot pressing the entirety thereof. The terminal 30 may be composed of a metal plate or the like.

The terminal 30 has a greater thickness than the metal body 20. Thus, when the blind hole 11 is formed by using a grinding tool such as a drill, even if the terminal 30 is ground to some extent by the grinding tool, damage such as breakage does not occur in the terminal 30.

The connection member 40 is a columnar member made of a metal such as tungsten, molybdenum, platinum, titanium, Kovar, nickel, or an alloy of these, and corresponds to a second metal member of the present invention. The outer diameter of the connection member 40 is slightly smaller than the inner diameter of the blind hole 11.

A leading end portion, of the connection member 40, which is connected to the terminal 30 is flat. However, the leading end portion has been subjected to chamfering, such as C-chamfering or R-chamfering. A female screw hole 41 is formed in a rear end portion of the connection member 40.

The power feeding rod 50 is made of a metal that is excellent in heat resistance, acid resistance, and conductivity, such as titanium, nickel, or the like. The power feeding rod 50 has a long round bar shape. A male screw portion 51 is formed in the leading end portion in the longitudinal direction of the power feeding rod 50. By the male screw portion 51 being engaged with the female screw hole 41 in the connection member 40, the power feeding rod 50 is connected to the connection member 40.

A connection member having a long round bar shape in which the connection member 40 and the terminal 30 are integrated with each other may be employed.

The shaft 60 is composed of a ceramic sintered body of aluminium nitride (AlN), alumina ($Al_2O_3$), yttria ($Y_2O_3$), or the like, similarly to the ceramic base body 10. The shaft 60 is formed in a hollow and substantially cylindrical shape as a whole.

The shaft 60 is mounted to the lower surface of the ceramic base body 10. The shaft 60 has, at the upper end thereof, a flange portion 62 having an enlarged diameter compared to the diameter of an intermediate portion 61. The ceramic base body 10 and the shaft 60 are joined together by solid-state welding, brazing, or the like. The power feeding rod 50 is disposed inside the shaft 60.

In the ceramic member 100, the exposed portion of the terminal 30 and the connection member 40 are connected to each other by means of a brazing material solidified portion 70. The brazing material solidified portion 70 is a layer formed as a result of solidification of the brazing material.

The brazing material solidified portion 70 is present between the terminal 30 and the connection member 40, but at least a part of the brazing material solidified portion 70 is also present in the enlarged portion 11b of the blind hole 11. The brazing material solidified portion 70 may occupy the entirety of the inside of the enlarged portion 11b, but may occupy only a part thereof. The brazing material solidified portion 70 may be present in the gap between the inner peripheral surface of the blind hole 11 and the outer peripheral surface of the connection member 40.

As described above, since at least a part of the brazing material solidified portion 70 which joins the terminal 30 and the connection member 40 together is present in the enlarged portion 11b of the blind hole 11, this portion exhibits anchor effect, thus enhancing the joining strength at the time when the connection member 40 is moved downwardly away from the terminal 30.

The brazing material may be a conventional brazing material that is used when joining the terminal 30 and the connection member 40 together. However, preferably, the brazing material has higher wettability to the terminal 30 and the connection member 40 than to the ceramic base body 10.

Preferably, the brazing material is, in particular, an inactive brazing material that does not contain any active metal such as titanium, and that has low wettability to the ceramic base body 10 composed of an aluminium nitride sintered body. This is because even if the ceramic base body 10 and the connection member 40 are not sufficiently joined with each other, it is possible to sufficiently secure the joining strength for the connection member 40 as described above. Accordingly, a brazing material having high fluidity is filled in the space, which realizes the anchor effect.

Preferably, the amount of the brazing material is substantially the same as the volume of the space. If the amount of the brazing material is greater than this, a melt having good fluidity goes up due to capillarity into the clearance between the connection member or the power feeding rod and the blind hole, which hinders the brazing material from being filled into the space. When the amount of the brazing material is too small, the amount of the brazing material to be filled in the space becomes too small, and thus, the anchor effect cannot be sufficiently exhibited.

When the space volume is defined as V, the amount of the brazing material is preferably 0.3V to 1V, and more preferably, 0.6V to 1V.

DESCRIPTION OF REFERENCE NUMERALS

10: ceramic base body
11: blind hole
11a: bottom face
11b: enlarged portion, enlarged-diameter portion
20: metal body
30: terminal (first metal member)
40: connection member (second metal member)
41: female screw hole
50: power feeding rod
51: male screw portion
60: shaft
70: brazing material solidified portion
100: ceramic member

What is claimed is:

1. A ceramic member comprising:
    a ceramic base body including a first metal member embedded therein, a lower surface, and an inner surface which, along with the first metal member, define a blind hole between the lower surface and the first metal member;
    a second metal member inserted in the blind hole; and
    a brazing material solidified portion connecting the second metal member to the first metal member, wherein
    the inner surface of the ceramic base body has, at least at the first metal member, an enlarged portion that is enlarged outwardly at least partially with respect to a radial direction;
    wherein the enlarged portion is at a deepest portion of the blind hole, and at least a part of the brazing material solidified portion is present in the enlarged portion.

2. The ceramic member according to claim 1, wherein the enlarged portion is enlarged outwardly over an entire circumference thereof with respect to the radial direction.

3. The ceramic member according to claim 1, wherein the brazing material solidified portion is a layer formed as a result of solidification of a brazing material that has higher wettability to the first metal member and the second metal member than to the ceramic base body.

4. The ceramic member according to claim 2, wherein the brazing material solidified portion is a layer formed as a result of solidification of a brazing material that has higher wettability to the first metal member and the second metal member than to the ceramic base body.

5. The ceramic member according to claim 1, wherein the brazing material solidified portion is a layer formed as a result of solidification of a brazing material that does not contain any active metal.

* * * * *